(12) United States Patent
Lee et al.

(10) Patent No.: US 11,089,707 B2
(45) Date of Patent: Aug. 10, 2021

(54) COMPUTING SYSTEM, APPARATUS AND ELECTRICAL COMPONENTS THEREOF

(71) Applicant: LENOVO ENTERPRISE SOLUTIONS (SINGAPORE) PTE. LTD., Singapore (SG)

(72) Inventors: Chang-Hsing Lee, New Taipei (TW); Chia-Ching Huang, Taipei (TW); Ta-Wei Chen, New Taipei (TW); Sung-Feng Chen, Taipei (TW); Ming Jie Chai, Singapore (SG)

(73) Assignee: Lenovo Enterprise Solutions (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 16/551,167

(22) Filed: Aug. 26, 2019

(65) Prior Publication Data
US 2020/0100376 A1 Mar. 26, 2020

(30) Foreign Application Priority Data
Sep. 6, 2018 (CN) .......................... 201811036328.3

(51) Int. Cl.
*H05K 5/02* (2006.01)
*H05K 7/14* (2006.01)

(52) U.S. Cl.
CPC ......... *H05K 5/0247* (2013.01); *H05K 7/1487* (2013.01); *H05K 7/1489* (2013.01); *H05K 7/1492* (2013.01)

(58) Field of Classification Search
None
See application file for complete search history.

(56) References Cited

U.S. PATENT DOCUMENTS

| | | | | |
|---|---|---|---|---|
| 7,323,027 | B1* | 1/2008 | Fu | B01D 46/0005 55/385.6 |
| 8,784,167 | B2* | 7/2014 | Yi | H05K 7/20172 454/184 |
| 9,506,375 | B2* | 11/2016 | Cachia | F04D 29/703 |
| 10,165,696 | B1* | 12/2018 | Blasingame | H05K 5/0208 |
| 10,624,235 | B2* | 4/2020 | Zhai | H05K 7/20727 |
| 2009/0154092 | A1* | 6/2009 | Chen | G06F 1/187 361/679.51 |
| 2009/0244843 | A1* | 10/2009 | Hirohata | F28G 1/08 361/696 |
| 2011/0157817 | A1* | 6/2011 | Li | G06F 1/20 361/679.48 |

(Continued)

*Primary Examiner* — Xanthia C Cunningham

(57) ABSTRACT

Embodiments disclosed herein provide an apparatus to enable smooth and safe assembly of functional modules to computer chassis. The apparatus includes a chassis and a pair of racks mounted to the chassis. Each rack has a plurality of gear teeth formed thereon. A module having a housing is slidably coupled to the chassis and disposed between the pair of racks. A pair of gear pinions are rotatably mounted to the housing and meshed to the gear teeth of one of the racks. A damping member is coupled between each gear pinion and the housing. A sliding movement of the housing relative to the chassis rotates the pair of gear pinions to roll over along the gear teeth. During the sliding movement of the housing, the damping member exerts a resistance force against the housing, to reduce the movement speed of the housing.

15 Claims, 15 Drawing Sheets

(56) References Cited

U.S. PATENT DOCUMENTS

| | | | |
|---|---|---|---|
| 2011/0216498 A1* | 9/2011 | Lee | G06F 1/20 361/679.33 |
| 2012/0113591 A1* | 5/2012 | Chuang | H05K 7/20172 361/695 |
| 2012/0114477 A1* | 5/2012 | Li | F04D 29/601 415/213.1 |
| 2013/0149168 A1* | 6/2013 | Sun | H05K 7/20172 416/244 R |
| 2014/0029191 A1* | 1/2014 | Terwilliger | H05K 7/20172 361/679.31 |
| 2014/0233185 A1* | 8/2014 | Wen | H05K 7/20172 361/695 |
| 2015/0282384 A1* | 10/2015 | Ho | H05K 7/20172 361/695 |
| 2015/0351280 A1* | 12/2015 | Gonzalez Inda | G06F 1/181 361/695 |
| 2015/0382492 A1* | 12/2015 | Oneufer | H05K 5/0017 312/295 |
| 2016/0029519 A1* | 1/2016 | Chen | H05K 7/20727 361/679.48 |
| 2016/0234966 A1* | 8/2016 | Li | F16M 13/02 |
| 2016/0295746 A1* | 10/2016 | Alvarado | G06F 1/181 |
| 2017/0055360 A1* | 2/2017 | Della Fiora | H05K 7/1427 |
| 2017/0114803 A1* | 4/2017 | Miwa | F04D 19/007 |
| 2020/0068740 A1* | 2/2020 | Tsorng | H05K 7/1487 |

* cited by examiner

COMPUTING SYSTEM, APPARATUS AND ELECTRICAL COMPONENTS THEREOF

CROSS-REFERENCE TO RELATED APPLICATION

This application claims priority under 35 U.S.C § 119 to Chinese patent application no. 201811036328.3, filed Sep. 6, 2018, the entire text of which is specifically incorporated by reference herein.

TECHNICAL FIELD

Disclosed herein relates to a computing system, a computing apparatus and electrical component for the computing system.

DESCRIPTION OF THE RELATED ART

Electrical components such as cooling fan modules and/or assemblies in a computing system are provided as independently-manufactured units and assembled to the computer chassis during system integration process. High speed computer systems require cooling fans with greater cooling capacity, which results in the cooling fan modules to become relatively larger in physical dimension and heavier in weight. Such fan modules may be handled without due care, in particular in the assembly process where the fan modules are typically assembled by dropping into the mounting bay on the computer chassis by gravity. Fallen fan modules may create mechanical impacts to the computer chassis and hence possibly causing damage to the components mounted to the fan module and/or the computer chassis, including the electrical connectors required to be physically mated to each other to establish electrical connections between the fan module and the computer system.

SUMMARY

In one aspect, embodiments disclosed herein provide an apparatus to enable smooth and safe assembly of functional modules to computer chassis. The apparatus includes a chassis and a coupling member mounted to the chassis. The coupling member is configured to receive and guide an electrical component to move within the chassis via an actuator of the electrical component. Upon the electrical component being introduced into the chassis, the coupling member of the computing apparatus engages with the actuator of the electrical component to exert a resistive force against the electrical component.

In another aspect, embodiments disclosed herein provide an electrical component comprising a housing and an actuator movably coupled to the housing. Upon the electrical component being introduced into a computing apparatus, the actuator engages with the computing apparatus, to exert a resistive force against the electrical component.

In a further aspect, embodiments discloses therein provide a computing system comprising a computer apparatus and an electrical component arranged within the computing apparatus. The apparatus includes a chassis and a coupling member mounted to the chassis. The coupling member is configured to receive and guide an electrical component to move within the chassis via an actuator of the electrical component. Upon the electrical component being introduced into the chassis, the coupling member of the computing apparatus engages with the actuator of the electrical component to exert a resistive force against the electrical component. The electrical component comprises a housing and an actuator movably coupled to the housing. Upon the electrical component being introduced into the computing apparatus, the actuator engages with the computing apparatus to exert a resistive force against the electrical component.

BRIEF DESCRIPTION OF THE DRAWINGS

The features of the embodiments will be more comprehensively understood in conjunction with the accompanying drawings, in which.

DETAILED DESCRIPTION

Figure 1:
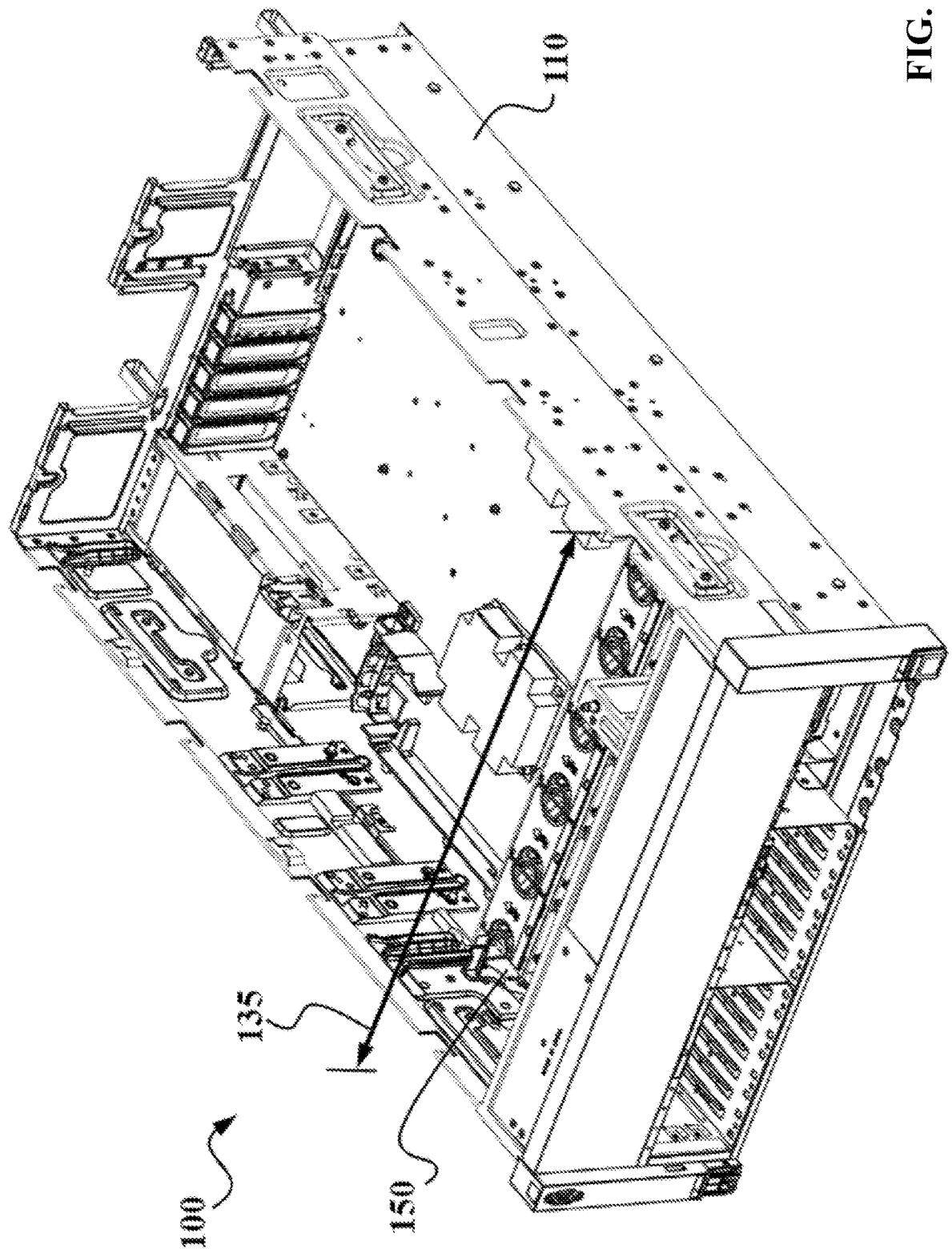
FIG. 1 is a perspective view illustrating a computer assembly according to one embodiment.

It will be readily understood that the components of the embodiments, as generally described and illustrated in the figures herein, may be arranged and designed in a wide variety of different configurations in addition to the described example embodiments. Thus, the following more detailed description of the example embodiments, as represented in conjunction with the figures, is not intended to limit the scope of the embodiments, as claimed, but is merely representative of example embodiments.

References throughout this specification to "one embodiment", "another embodiment" or "an embodiment" (or the like) means that a particular feature, structure, or characteristic described in connection with the embodiment is included in at least one embodiment. Thus, the appearance of the phrases "in one embodiment" or "in an embodiment" or the like in various places throughout this specification are not necessarily all referring to the same embodiment.

Furthermore, the described features, structures, or characteristics may be combined in any suitable manner in one or more embodiments. In the following description, numerous specific details are provided to give a thorough understanding of embodiments. One skilled in the relevant art will recognize, however, that the various embodiments can be practiced without one or more of the specific details, or with other methods, components, materials, etc. In other instances, some or all known structures, materials, or operations may not be shown or described in detail to avoid obfuscation.

According to one aspect, the embodiments disclosed herein provide a computing system to enable smooth and safe assembly of electrical components and functional modules to a computing apparatus. The computing system includes a chassis, an electrical component movably coupled to the chassis, and a damping device coupled between the chassis and the electrical component. The damping device has a base, an actuator movably coupled to the base, and a restraining member disposed between the base and the actuator. The base is mounted to one of the chassis and a housing of the electrical component, and the actuator is engaged to the other one of the chassis and the housing of the electrical component. Movement of the electrical component relative to the chassis causes the actuator to move relative to the base to exert a resistive force against the electrical component.

According to another aspect, the embodiments disclosed herein provide an electrical component for a computer system. The electrical component includes a housing configured to be assembled to a computer chassis, and a damping device coupled to the housing. The damping device has a base mounted to the housing, an actuator movably coupled to the base, and a restraining member disposed between the base and the actuator. Upon the electrical component being introduced into a computing apparatus, the actuator is brought into engagement with the computing apparatus, and movement of the electrical component relative to the computing apparatus causes the actuator to move relative to the base to exert a resistive force against the electrical component.

The embodiments will be described in detail with reference to the accompanying drawings hereinafter. In the description and the accompanying drawings, the same or similar reference numerals will be used to indicate substantially same elements and functions, and the duplicate description of these elements and functions may or may not be fully or partially repeated. In addition, for the sake of clarity and simplicity, the description of some or all known functions and constructions in the art can be omitted.

Figure 2:
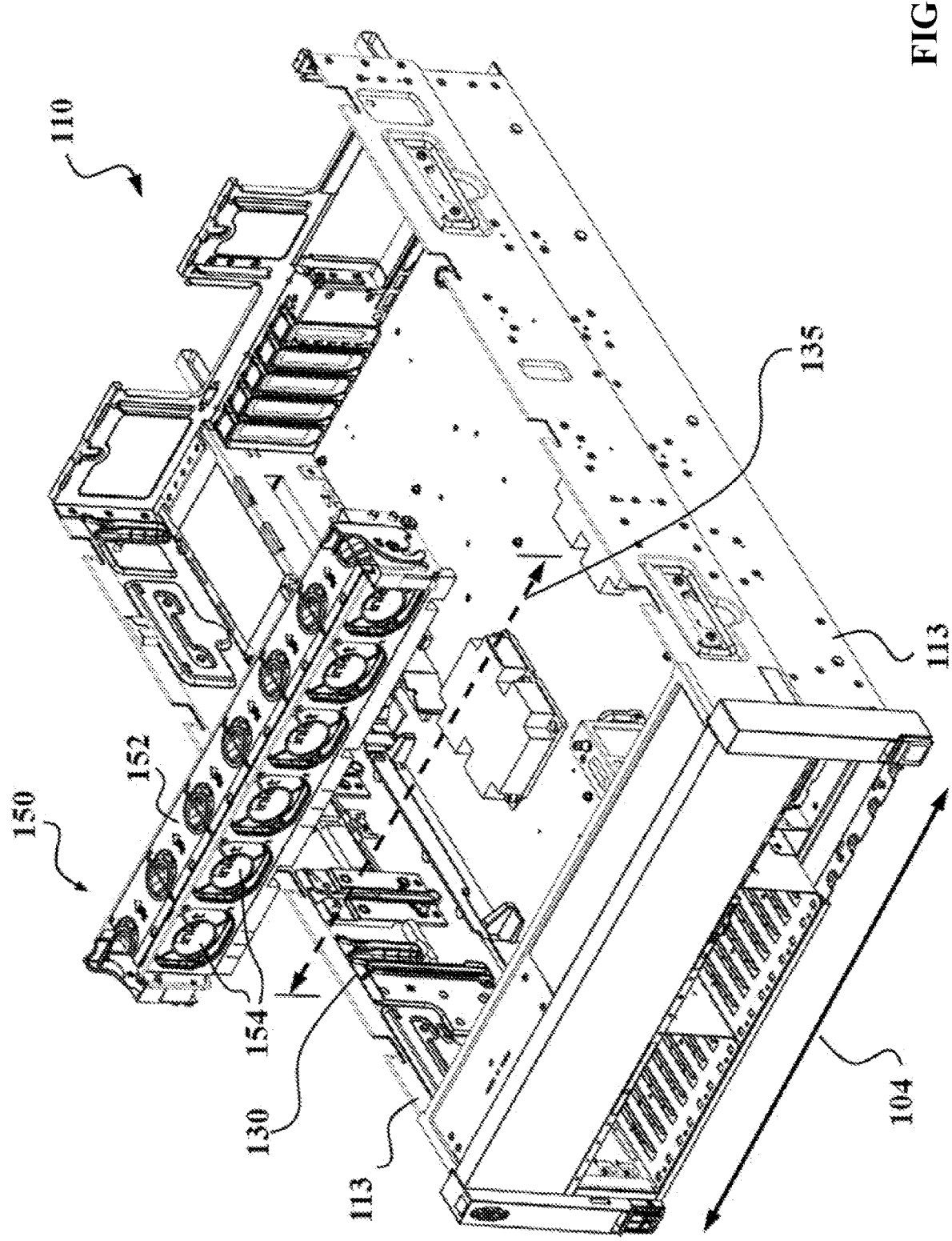
FIG. 2 is an exploded view of the computer assembly shown in FIG. 1.

As shown in FIGS. 1 and 2, in one embodiment, a computing system 100 includes a computer chassis 110, a pair of coupling members, such as gear racks 130 each mounted to a sidewall 113 of the chassis 110, and an electrical component or functional module of a computing system, such as a fan module 150 and housing 152 supporting one or more cooling fans 154 and removably coupled to the chassis 110. The pair of racks 130 are spaced apart from each other with respect to a lateral direction 104 of the chassis 110. The pair of racks 130 provides a mounting bay 135 therebetween to receive the fan module 150.

Figure 3:
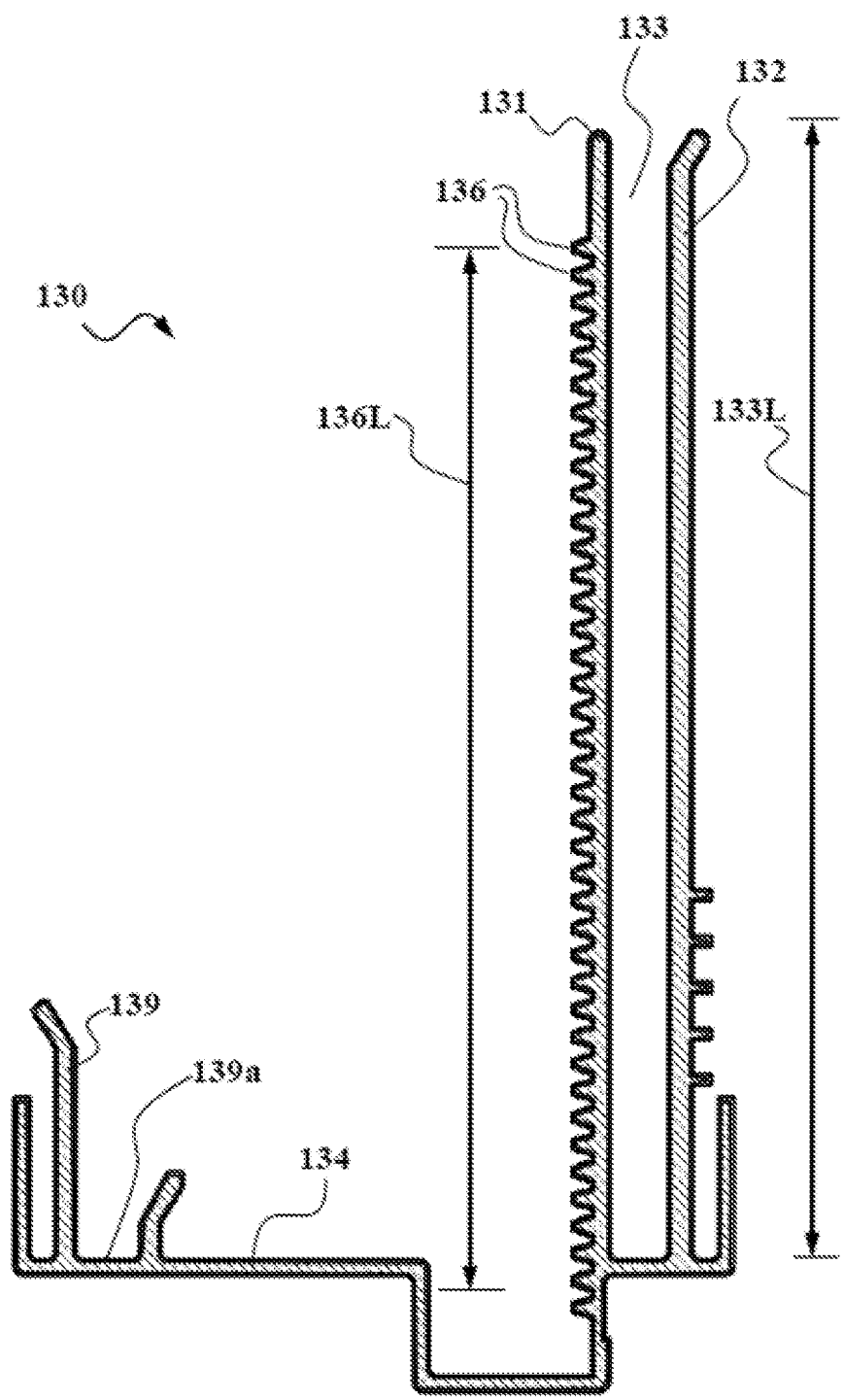
FIG. 3 is an enlarged partial side view showing one of the racks and a portion of the bottom plate of the chassis of the computer assembly shown in FIG. 1.
Figure 4:
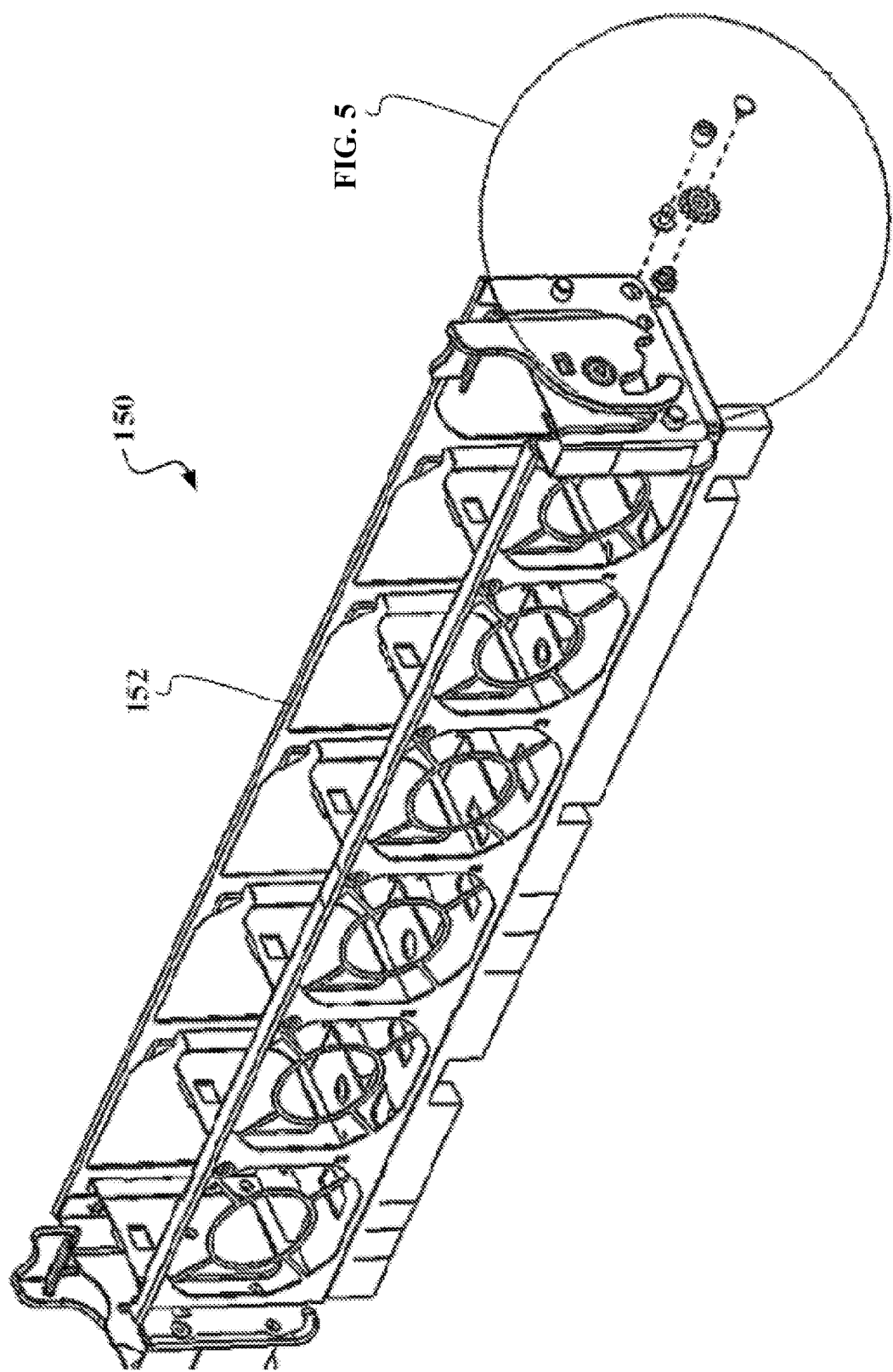
FIG. 4 is a perspective view of a fan module of the computer assembly shown in FIG. 1.
Figure 5:
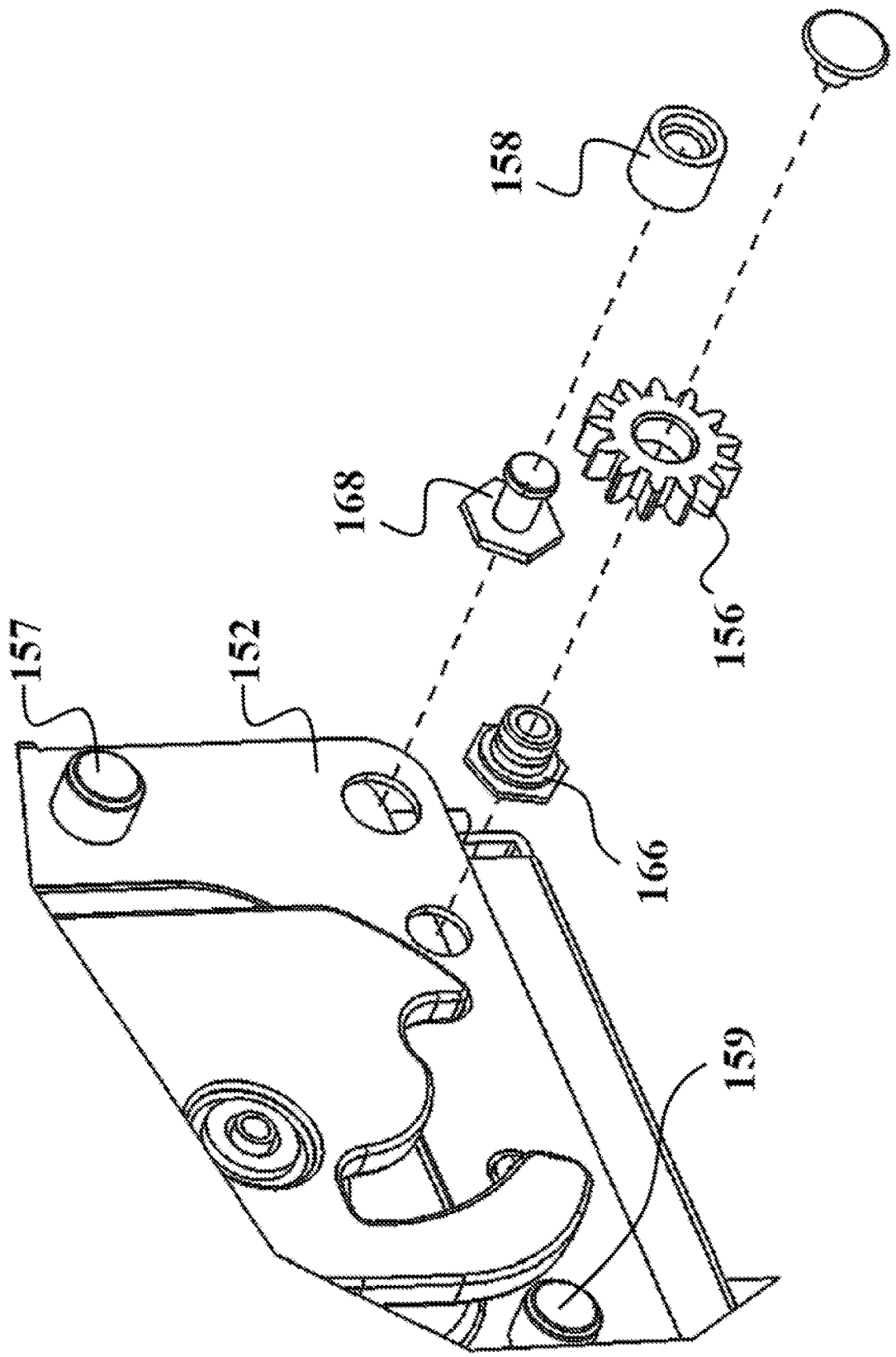
FIG. 5 is an enlarged view of portion 5 of FIG. 4.
Figure 6:
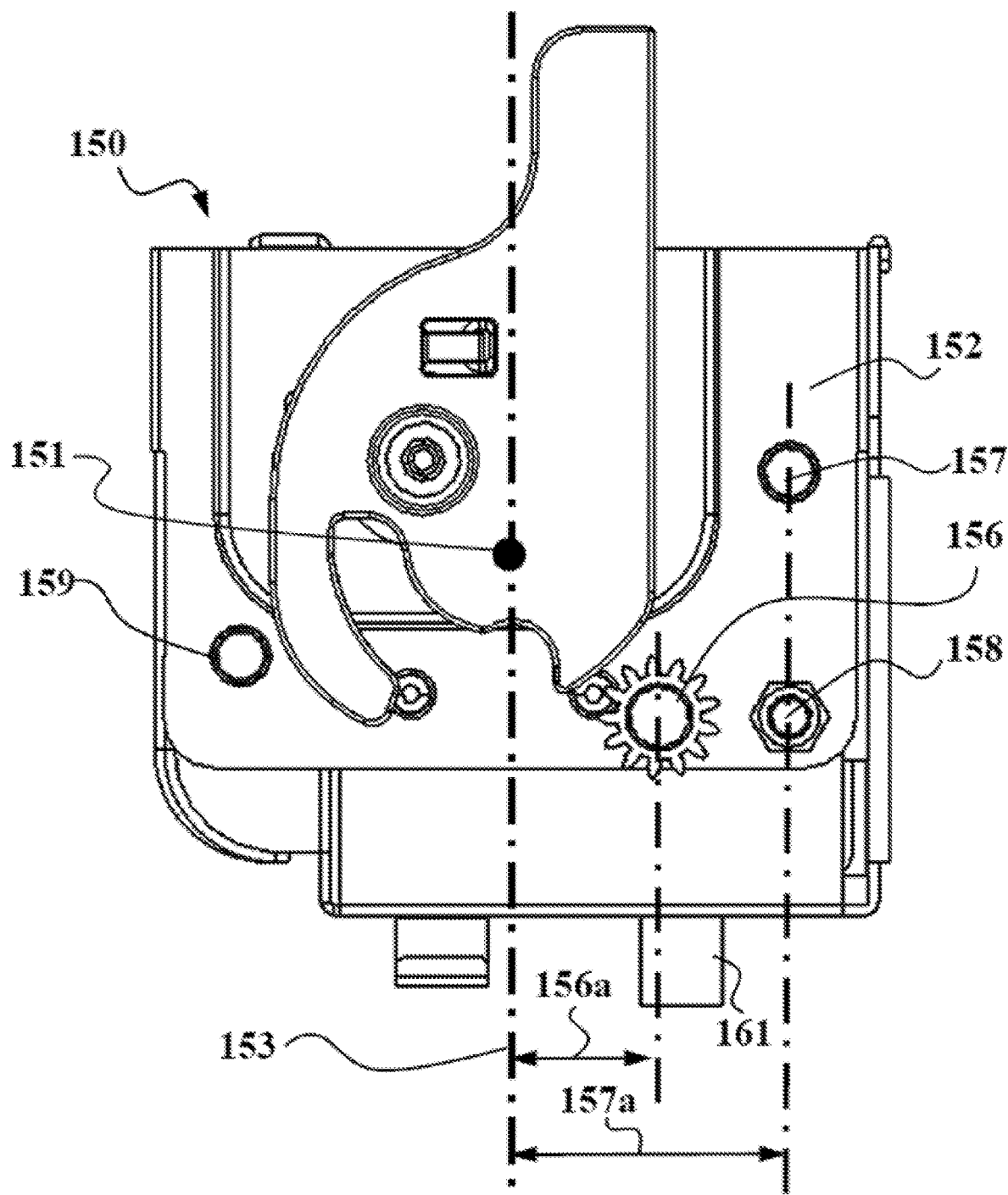
FIG. 6 is an enlarged side view of FIG. 4.
Figure 7:
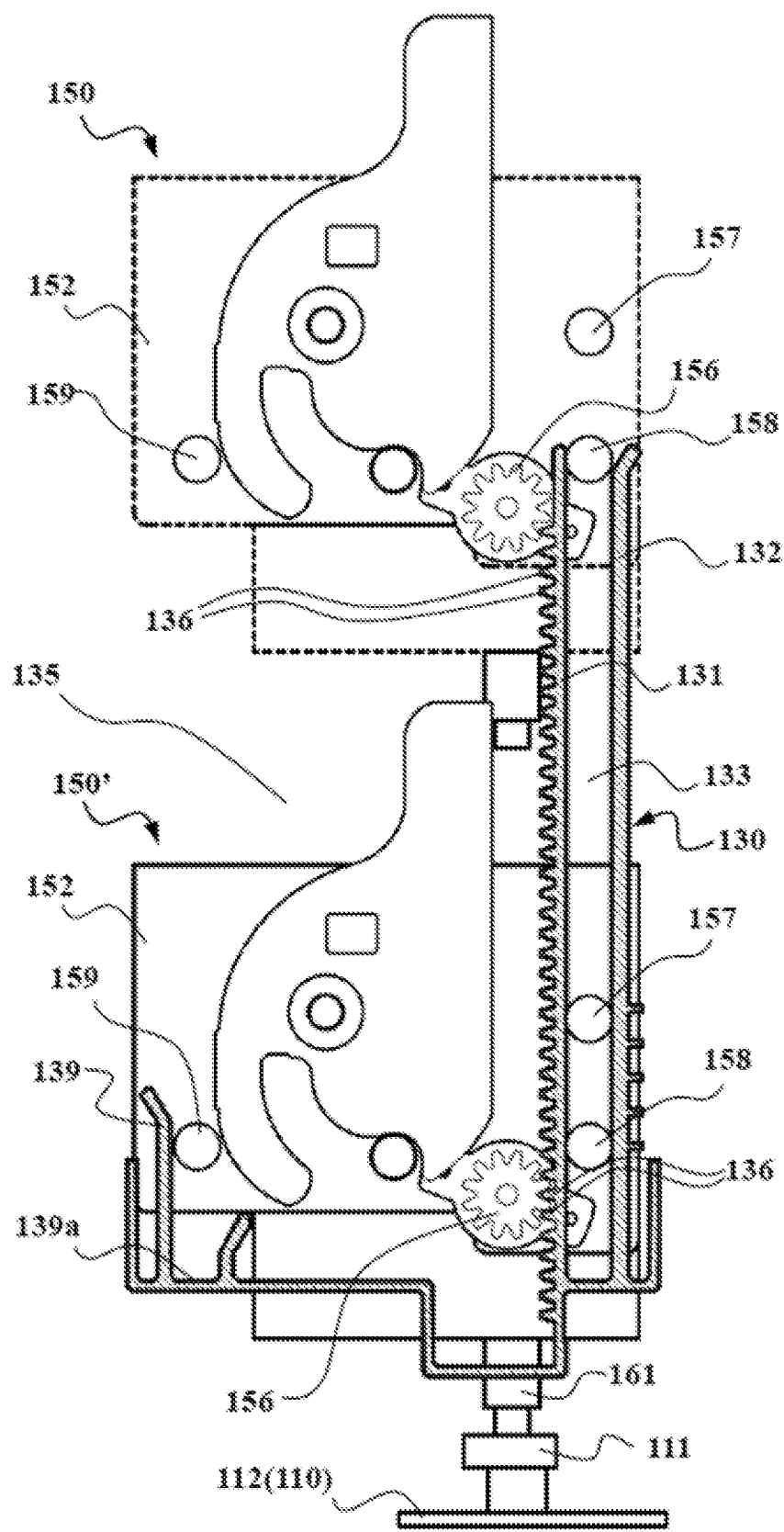
FIG. 7 is a schematic view showing a fan module at two positions during the assembly process to the chassis of the computer assembly shown in FIG. 1.

As shown in FIG. 3, each rack 130 has a first rail 131 and a second rail 132 positioned parallel to each other and form a rail channel 133 therebetween. Along the outer side of the first rail 131, opposite to the rail channel 133, there are formed a plurality of gear teeth 136 arranged in a straight line parallel to the rail channel 133. Rack 130 is arranged with the first and second rails 131, 132 oriented perpendicular to a bottom plate 112 of the chassis 110. The gear teeth 136 are aligned parallel to the rail channel 133, with an overall teeth length 136L of the gear teeth 136 the same or less than an overall rail length 133L of the rail channel 133. Rack 130 may further include an auxiliary rail 139 positioned spaced apart from the first rail 131 and the second rail 132. Auxiliary rail 139 is orientated parallel to the first and second rails 131 and 132, and is connected to the first and second rails 131 and 132 by a horizontal bar 134. At the end of the auxiliary rail 139 there is formed a stopper 139a.

As shown in FIGS. 4 to 7 with further details, fan module 150 has a housing 152 to support one or more cooling fans thereon. On each side surface of the housing 152 there is rotatably mounted an actuator, e.g. a gear pinion 156. Each gear pinion 156 is rotatable relative to the housing 152 about a base, e.g. a pinion seat 166 mounted to the housing 152.

The housing 152 is shaped and dimensioned to fit between the pair of racks 130 such that, upon the fan module 150 being received into the mounting bay, the housing 152 becomes slidably engaged to the rail channels 133 by which the fan module 150 is able to be assembled to the chassis 110 by the housing 152 sliding downwardly along the rail channels 133 of the pair of racks 130.

Gear teeth 136 and the pair of gear pinions 156 are configured to have the same gear module such that, upon the housing 152 being engaged to the rail channels 133, and that the gear pinions 156 brought into contact with the gear teeth 136, the gear pinions 156 and the rack 130 become meshed to each other.

Each gear pinion 156 is rotatably coupled to the housing 152, via a pinion seat 166 mounted to the housing 152. Pinion seat 166 has a chamber or inner space in which, a restraining/damping member or damping medium such as a damping oil, damping grease or the like, is accommodated and sealed and in contact with the gear pinion 156, to create a resistance force against the rotation of each gear pinion 156 relative to the housing 152. Gear pinion 156, pinion seat 166 and the restraining member therefore form a damping device.

Fan module 150 may further include upper and lower guiding members 157, 158, and an auxiliary guiding member 159 mounted to the housing 152. Upper and lower guiding members 157 and 158 are positioned at the same side as the gear pinion 156 with respect to a reference axis 153 passing through the center of gravity 151 of the fan module 150 along vertical direction. The auxiliary guiding member 159 is positioned at an opposite side of the gear pinion 156 with respect to the reference axis 153. The upper and lower guiding members 157 and 158 are aligned along a vertical direction, and are positioned away from the reference axis 153 at a horizontal distance 157a which is greater than the horizontal distance 156a between the gear pinion 156 and the reference axis 153.

The upper guiding member 157 and the auxiliary guiding member 159 are positioned away from the gear pinion 156 relative to the lower guiding member 158 with respect to the vertical direction. The upper guiding member 157 and the auxiliary guiding member 159 may be in the form of a pin fixedly mounted to and projecting outwardly from the housing 152. The lower guiding member 158 may be a sleeve rotatably coupled to the housing 152 via a shaft 168 mounted to the housing 152. Alternatively, at least one of the auxiliary guiding member 159 and the upper and lower members 157, 158 may be configured to be rotatable. The fan module 150 further includes an electrical connector 161 mounted at the bottom end of the fan module 150 and the counterpart electrical connector 111 mounted on the bottom plate 112 of the chassis 110.

Figure 8:
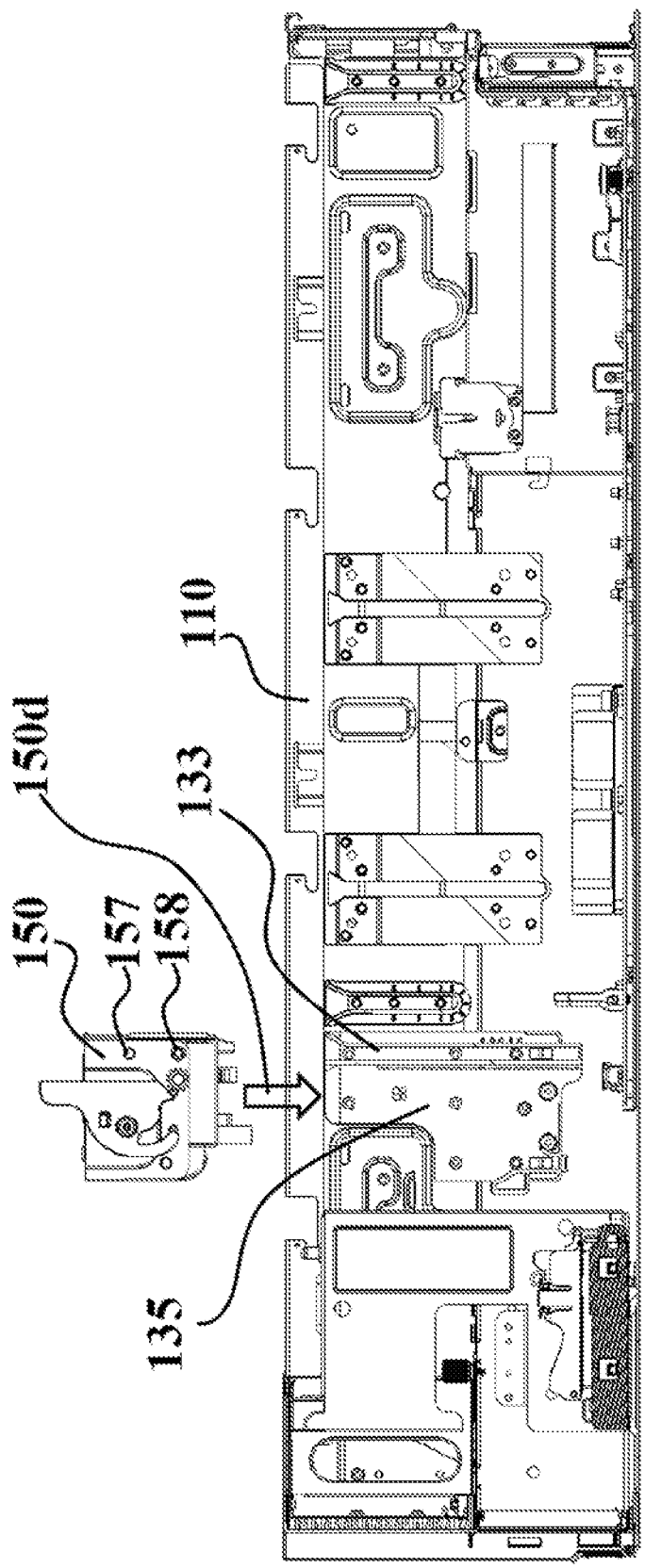
FIG. 8 is a side view of FIG. 2.
Figure 9:
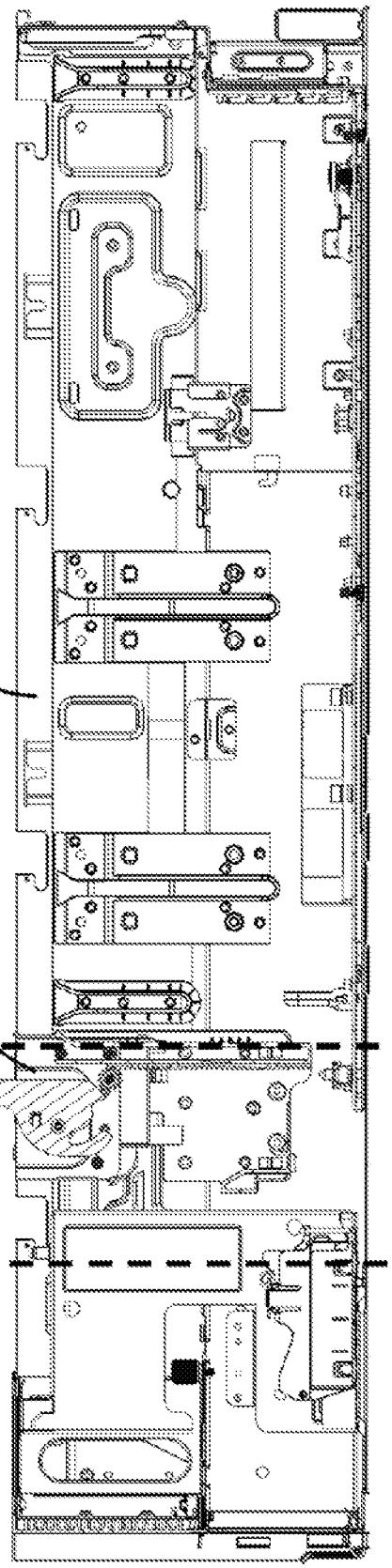
FIG. 9 is a side view of FIG. 8 showing a fan module during the assembly process to the chassis.

In use, as shown in FIGS. 7 to 12, fan module 150 is firstly held at a pre-assembling position above the chassis 110, with the housing 152 positioned in alignment with the mounting bay along the vertical direction, and with the upper and lower guiding members 157 and 158 positioned in alignment with the rail channels 133 along vertical direction (only one rail 133 is shown in FIG. 8).

To assemble to the chassis 110, fan module 150 is released from the pre-assembling position to drop into the mounting bay by gravity, along dropping direction 150d. Upon the lower guiding member 158 being received and fitted into the rail channel 133, the housing 152 becomes slidably engaged to the rail channels 133. Continuous dropping of the housing 152 down the mounting bay 135 will cause the upper guiding member 157 to fit into the rail channels 133 upon which, the housing 152 is guided and restricted to move in the mounting bay 135 along the vertical direction.

Further dropping of the housing 152 down the mounting bay will bring the gear pinions 156 into contact with the gear teeth 136, upon which, the gear pinions 156 and the gear teeth 136 become meshed to each other. Rotatably coupled to the housing 152, the gear pinions 156 follows the sliding movement of the housing 152 dropping down the mounting bay 135. As being meshed to the gear teeth 136, the gear pinions 156 rotate relative to the housing 152 and in the meantime roll over the gear teeth 136, while following the sliding movement of the housing 152 toward the bottom plate 112 of the chassis 110.

Rotation of the gear pinions 156 exerts a force against the damping member or the damping medium in the pinion seat 166. In response, the damping member or damping medium generates a resistance force 156F against the rotation direction of the gear pinions 156. The resistance force is transferred to and counteracts against the housing 152 in a direction opposite to the movement direction 152m of the housing 152, i.e. in an upward direction against the gravity of the fan module 150, by which, the dropping speed of the fan module 150 is reduced.

The damping oil is selected with a viscosity to create the resistance force and the movement speed reduction effect to the fan module 150, based on the desired speed of movement of the fan module 150 relative to the first and second rails 131 and 132, during the assembly process of the fan module 150 to the chassis 110.

Reduction of the dropping speed allows the fan module 150 to be assembled into the mounting bay 135 of the chassis 110 in a damped manner, with a smooth and slow movement relative to the chassis 110. Possible mechanical impacts caused by the fan module 150 to the chassis 110 and/or other components assembled on the computer system is therefore reduced.

During the sliding movement of the housing 152, the lower guiding member 158 may roll over the inner side surface of the first rail 131, to further smoothen the movement of the housing 152 down the mounting bay 135.

Figure 10:
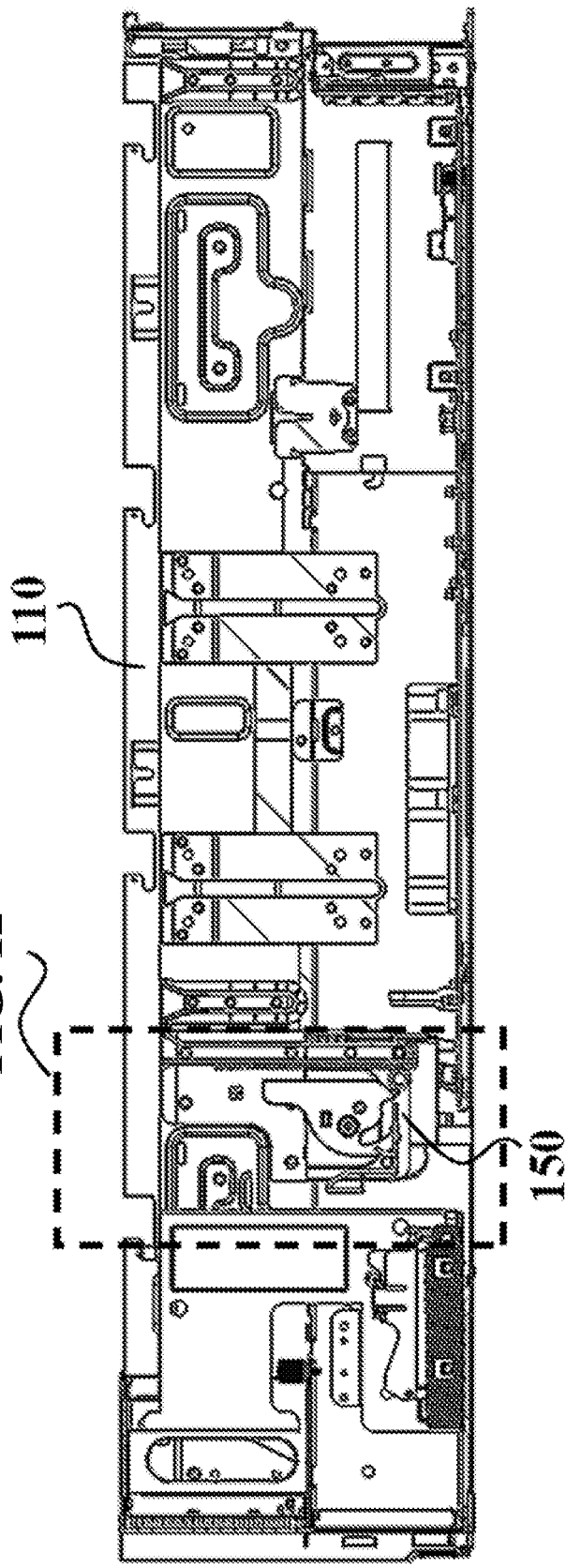
FIG. 10 is a side view of FIG. 8 showing a fan module at an assembled position the chassis.
Figure 11:
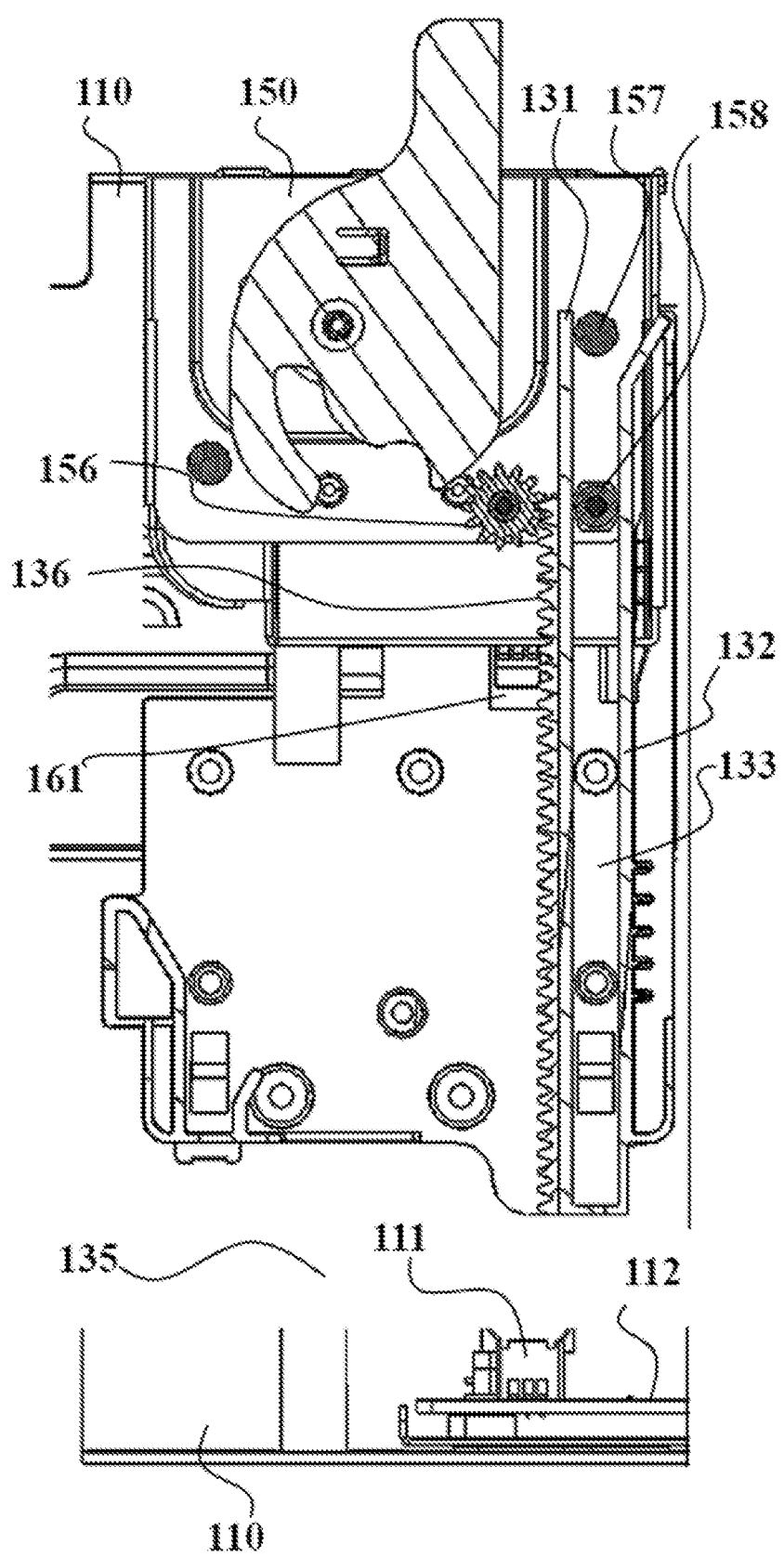
FIG. 11 is an enlarged side view of portion 11 of FIG. 9.
Figure 12:
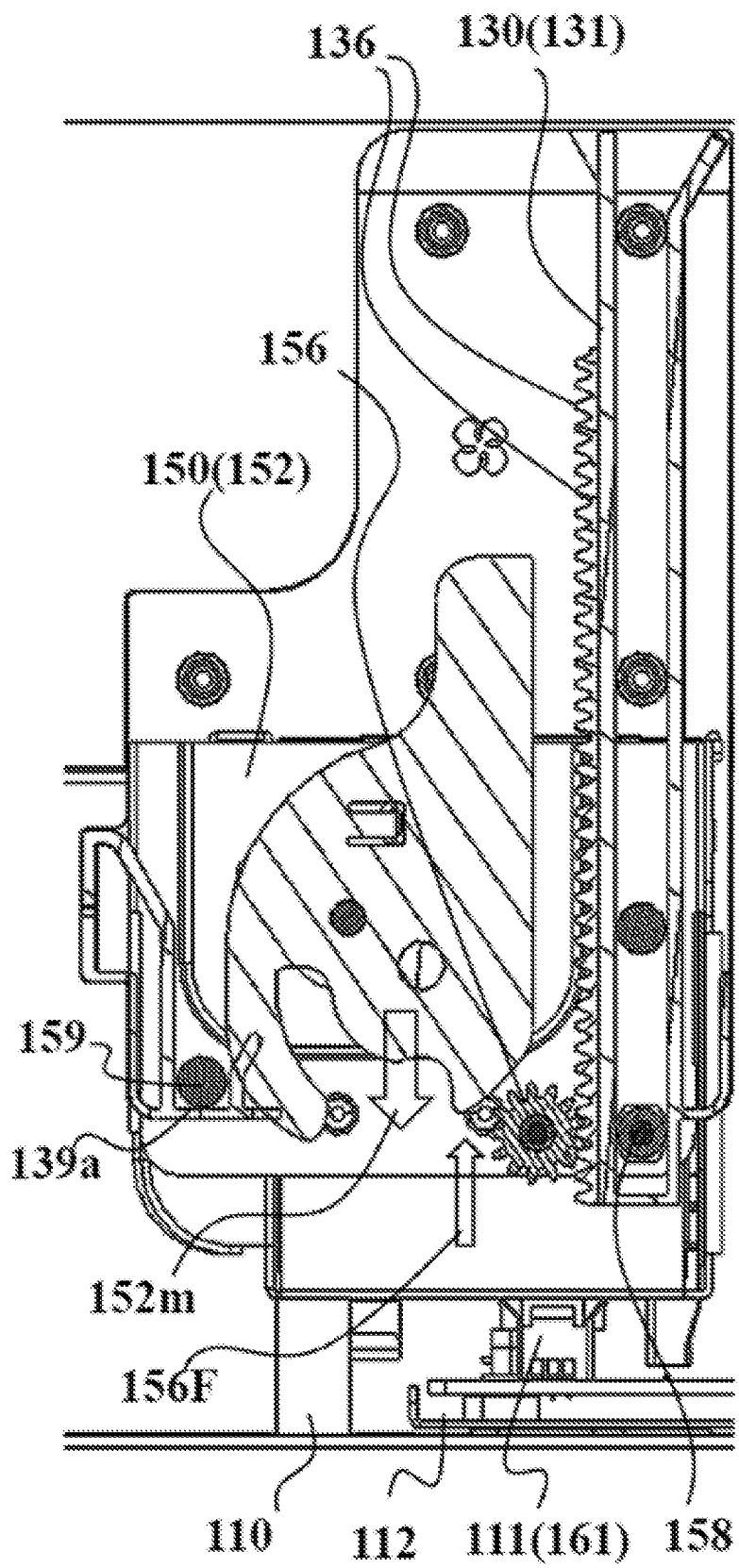
FIG. 12 is an enlarged side view of portion 12 of FIG. 10.

Upon the fan module 150 approaching closer to the bottom plate 112 to position 150', i.e. to the assembled position as shown in FIGS. 10 and 12, the electrical connector 161 mounted at the bottom end of the fan module 150 and the counterpart electrical connector 111 mounted on the chassis 110 become better aligned with respect to each other. Electrical connectors 161 and 111 are brought into contact with each other while the fan module 150 slides down the mounting bay 135 in a damped manner.

Upon the fan module 150 reaching the assembled position, as shown in FIGS. 10 and 12, the auxiliary guiding member 159 is brought into contact with and abuts against the stopper 139a. In the meantime, the electrical connectors 161 and 111 are positioned in proper alignment and docked to each other, to establish reliable electrical connections between the fan module 150 and the chassis 110.

In the process of the gear pinions 156 rolling over the gear teeth 136, the lower guiding member 158 abuts against the inner side surface of the first rail 131, to prevent shifting of the housing 152 along the horizontal direction relative to the racks 130. Possible disengagement of the gear pinions 156 from the gear teeth 136 is therefore prevented.

Figure 13:
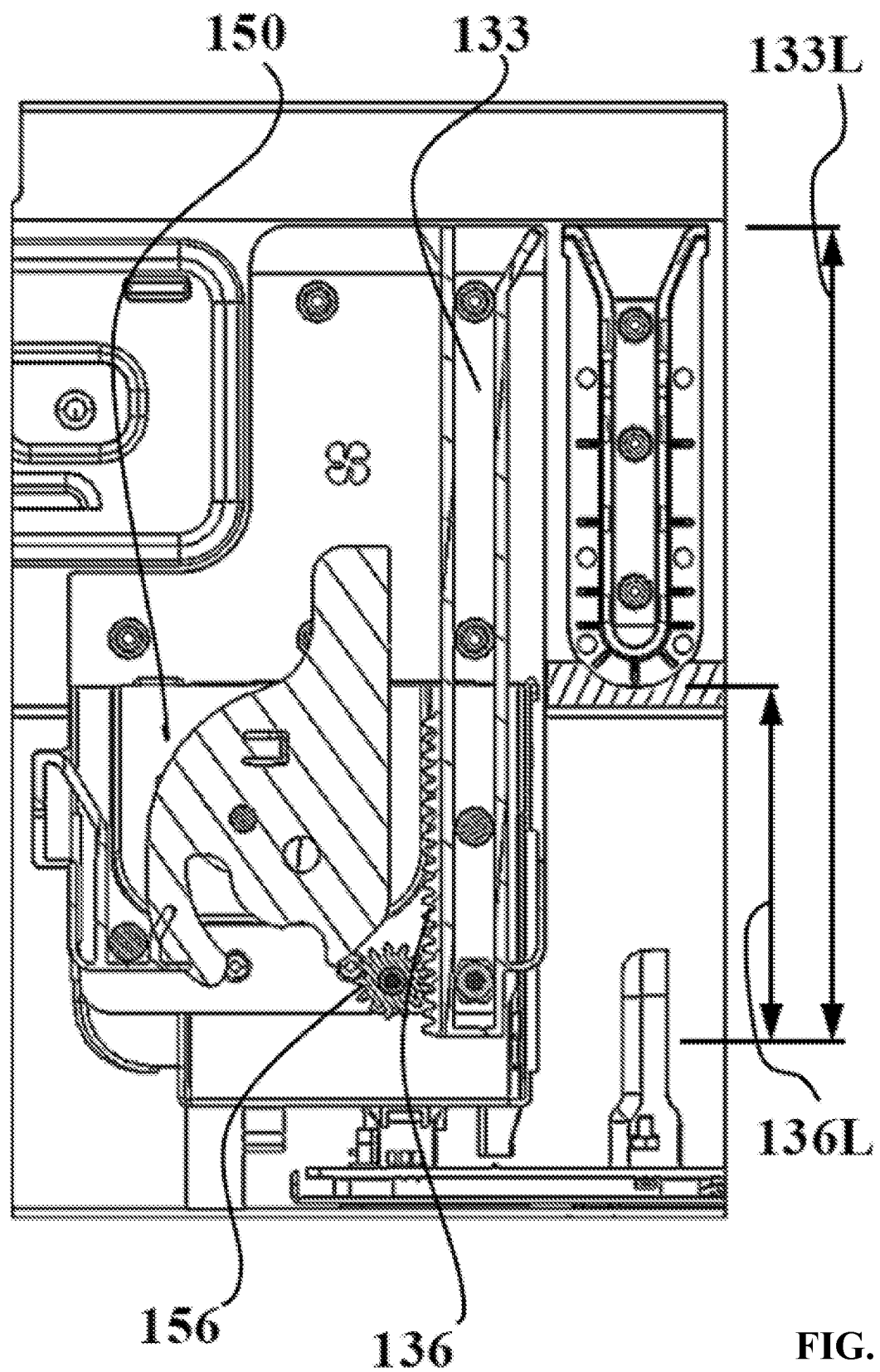
FIGS. 13 and 14 are side views showing rack structures according to alternative embodiments.

As shown in FIG. 13, the overall length 136L along which the gear teeth 136 are formed, may be configured to be substantially shorter than the overall length 133L of the rail 133, e.g. about half of the length 133L, based on the physical dimension/weight of the module 150 which is relatively smaller/lighter. Configuring the overall length 136L of the gear teeth 136 in this manner allows dropping of the module 150 in a faster speed before the gear pinions 156 are brought into contact with the gear teeth 136, by which relatively smaller/lighter modules may be assembled in a faster manner.

Figure 14:
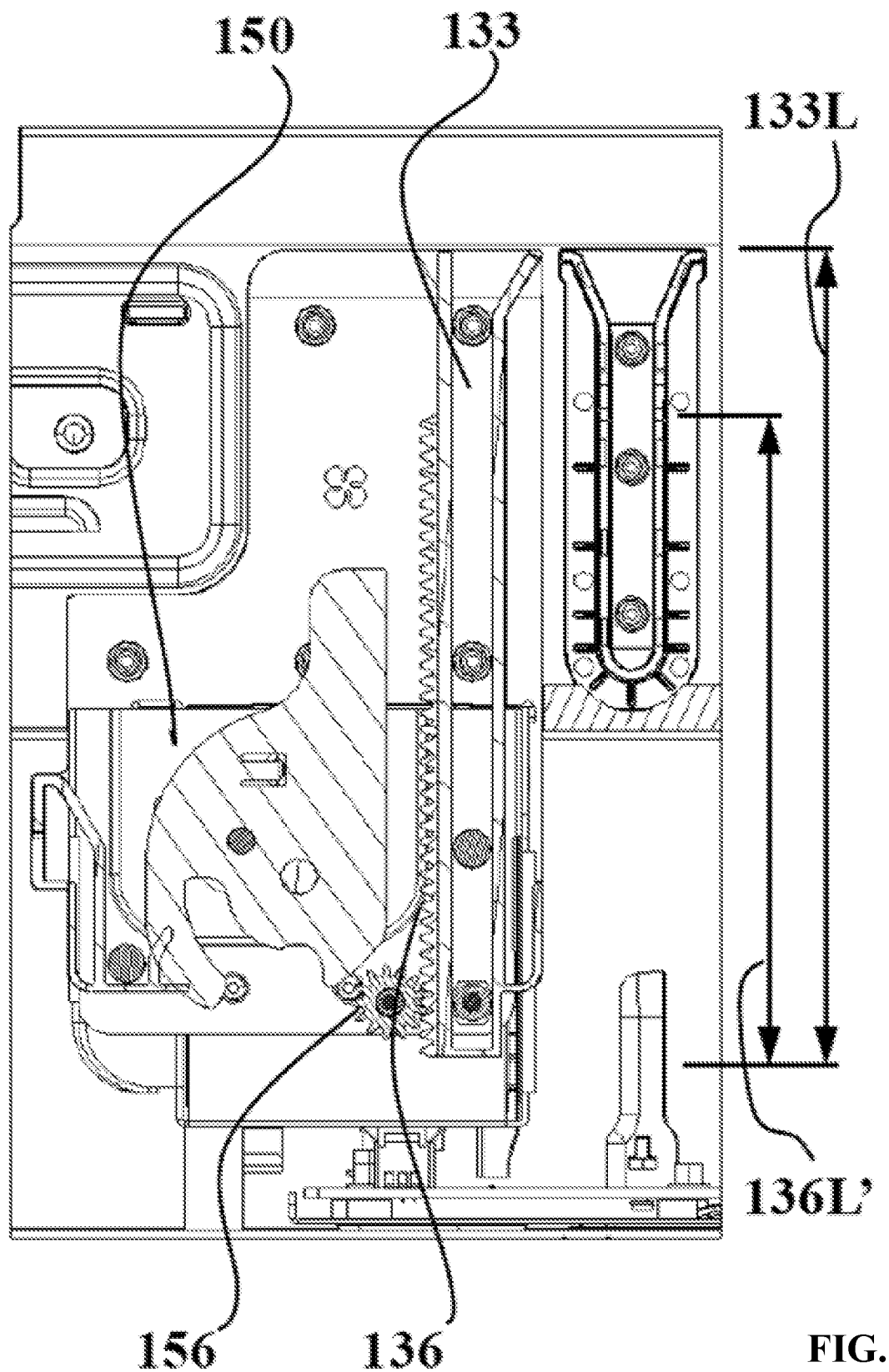

Alternatively, as shown in FIG. 14, the overall length 136L' along which the gear teeth 136 are formed, may be configured to be slightly shorter than the overall length 133L of the rail 133, e.g. about 80% to 90% of the length 133L, or even full length of the length 133L, based on the physical dimension/weight of the module 150 which is relatively bigger/heavier. Configuring the overall length 136L of the gear teeth 136 in this manner allows dropping of the module 150 in a slower speed, before the gear pinions 156 are brought into contact with the gear teeth 136, by which relatively larger/heavier modules may be assembled in a stable and smooth procedure.

As used herein, the singular "a" and "an" may be construed as including the plural "one or more" unless clearly indicated otherwise.

This disclosure has been presented for purposes of illustration and description but is not intended to be exhaustive or limiting. Many modifications and variations will be apparent to those of ordinary skill in the art. The example embodiments were chosen and described in order to explain principles and practical application, and to enable others of ordinary skill in the art to understand the disclosure for various embodiments with various modifications as are suited to the particular use contemplated.

Thus, although illustrative example embodiments have been described herein with reference to the accompanying figures, it is to be understood that this description is not limiting and that various other changes and modifications may be affected therein by one skilled in the art without departing from the scope or spirit of the disclosure. For instance, it should be appreciated that the damping device is not limited to include the gear teeth 136 and that other configurations of the damping device could be envisaged. As an alternative of having the base of the damping device being mounted to the movable object of a computing system, which is the electrical component as per the above-illustrated embodiment, the base of the damping device may be mounted to the stationary object of a computing system, which is computer chassis of the computing system, and with the actuator engaging the movable object. Both configurations provide damping and shock-absorbing effects for assembling an electrical component to a computing apparatus.

Figure 15:
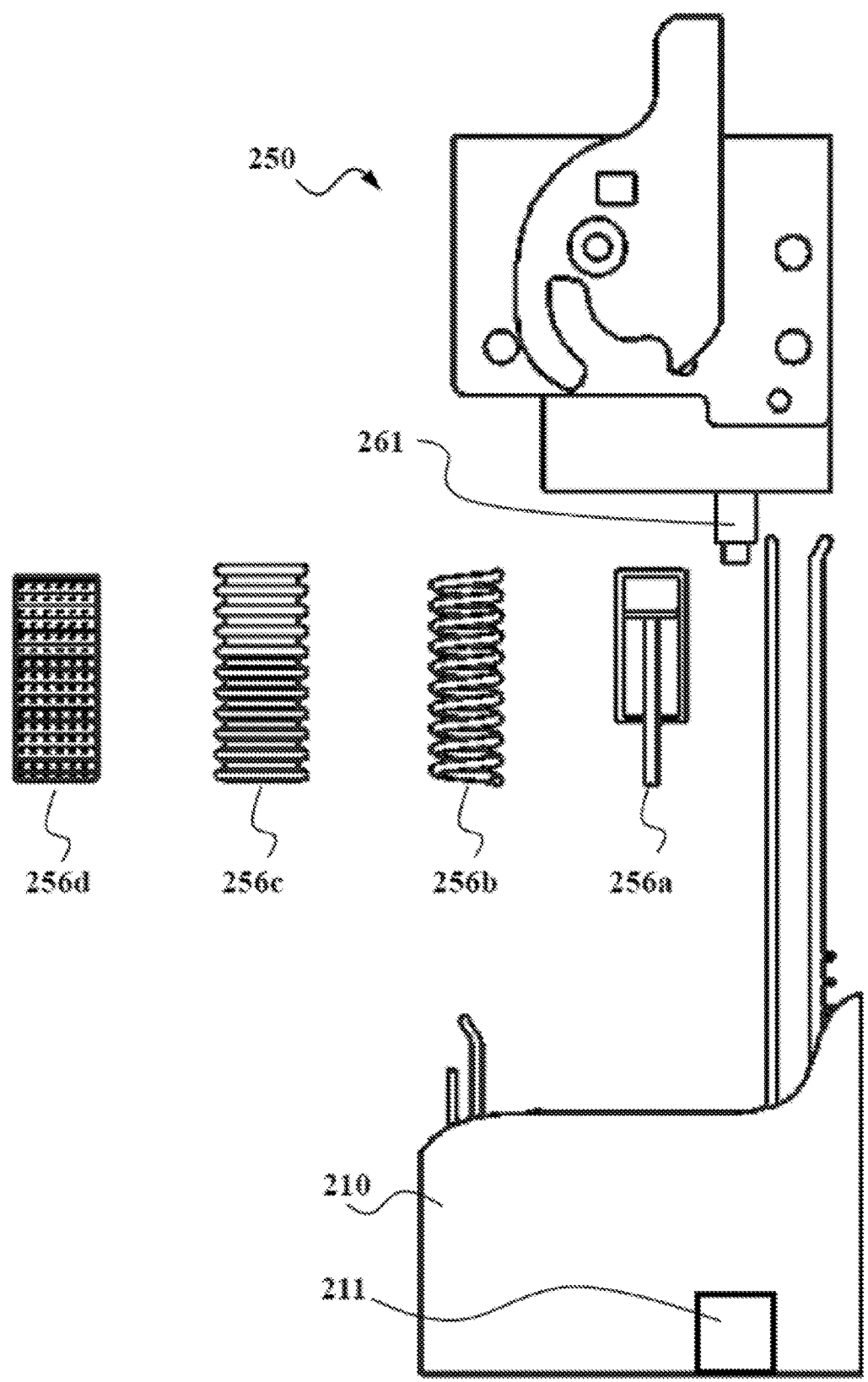
FIG. 15 is a schematic diagram showing further embodiments.

Shown in FIG. 15 as non-exhaustive embodiments, a damping device may be a damping cylinder 256a, a spring 256b, a bellow 256c or shock absorbing pad/foam/cushion 256d mounted to, or coupled between, an electrical component such as a computer fan module 250, and/or a computer chassis 210 to which the fan module 250 is to be assembled. Damping device of such embodiments provides damping and shock-absorbing effects similar to that in the afore-illustrated embodiments to assist in the assembly process of the fan module 250 to the chassis 210 to improve the connection of the electrical connector 211 mounted to the chassis and the counterpart electrical connector 261 mounted to the fan module 250.

The invention claimed is:

1. A computing apparatus, comprising:
a chassis; and
a coupling member mounted to the chassis, the coupling member configured to receive and guide an electrical component to move within the chassis via an actuator of the electrical component;
wherein, upon the electrical component being introduced into the chassis, the coupling member of the computing apparatus engages with the actuator of the electrical component to exert a resistive force against the electrical component;
wherein the actuator is mounted to the electrical component and upon the electrical component being introduced into the chassis, the coupling member is brought into engagement with the actuator, and wherein movement of the electrical component relative to the chassis causes the actuator to move relative to the electrical component to exert a resistive force against the electrical component;
wherein the coupling member is a gear rack and the actuator is a gear pinion,
wherein upon the electrical component being introduced into the chassis, the gear rack is meshed with the gear pinion, wherein sliding movement of the electrical component relative to the chassis causes the gear pinion to roll over along the gear rack during which the gear pinion rotates relative to the base to exert a resistive force against the electrical component.

2. The computing apparatus of claim 1, wherein the gear rack further comprises a first rail onto one side of which a plurality of gear teeth are formed and a second rail parallel to the first rail to form a guiding channel between the first and second rails.

3. The computing apparatus of claim 1, further comprising an electrical connector mounted at a bottom end of the chassis, wherein the electrical connector is mated to a counterpart electrical connector mounted to the electrical component during which the resistive force is exerted against the electrical component.

4. An electrical component, comprising:
a housing;
an actuator movably coupled to the housing;
wherein upon the electrical component being introduced into a computing apparatus, the actuator engages with the computing apparatus to exert a resistive force against the electrical component; and
a base mounted to the housing and engagable to the actuator, wherein movement of the electrical component relative to the computing apparatus causes the actuator to move relative to the base to exert a resistive force against the electrical component
wherein the actuator is a gear pinion rotatably coupled to the base, wherein upon the electrical component being introduced into the computing apparatus, the gear pinion is meshed with a gear rack mounted to the computing apparatus.

5. The electrical component of claim 4, further comprising a guiding slider mounted to the housing.

6. The electrical component of claim 5, wherein the guiding slider is positioned horizontally flush with respect to and spaced apart from the gear pinion.

7. The electrical component of claim 5, wherein a reference axis is defined to vertically passing through a gravity center thereof, wherein the gear pinion is positioned closer to the reference axis than the guiding slider.

8. The electrical component of claim 4, further comprising an electrical connector mounted at a bottom plate thereof, wherein the electrical connector is mated to a counterpart electrical connector mounted to the computing apparatus during which the resistive force is exerted against the electrical component.

9. A computing system, comprising:
a computing apparatus comprising:
a chassis, and
a coupling member mounted to the chassis, the coupling member configured to receive and guide an electrical component to move within the chassis via an actuator of the electrical component,
wherein, upon the electrical component being introduced into the chassis, the coupling member of the computing apparatus engages with the actuator of the electrical component to exert a resistive force against the electrical component; and
an electrical component arranged within the computing apparatus, wherein the electrical component comprises:
a housing,
the actuator movably coupled to the housing,
wherein upon the electrical component being introduced into the computing apparatus, the actuator engages with the computing apparatus to exert a resistive force against the electrical component; and
a base mounted to the housing and engagable to the actuator, wherein movement of the electrical component relative to the computing apparatus causes the actuator to move relative to the base to exert a resistive force against the electrical component.

10. The computing system of claim 9, wherein the base is mounted to the housing of the electrical component, and the actuator is engaged to the chassis.

11. The computing system of claim 10, further comprising a coupling member mounted to the chassis and engaged to the actuator, wherein the actuator is a gear pinion rotatably coupled to the base, the coupling member is a gear rack meshed to the gear pinion, wherein sliding movement of the electrical component relative to the chassis causes the gear pinion to roll over along the gear rack during which the gear pinion rotates relative to the base to exert a resistive force against the electrical component.

12. The computing system of claim 11, wherein the gear rack further comprises a first rail onto one side of which a plurality of gear teeth are formed and a second rail parallel to the first rail to form a guiding channel between the first and second rails, wherein the computing system further comprises a guiding slider mounted to the housing of the electrical component and coupled to the guiding channel to direct the movement of the electrical component relative to the chassis.

13. The computing system of claim 12, wherein the guiding slider is positioned horizontally flush with respect to and spaced apart from the gear pinion, wherein upon the gear pinion meshing with the gear rack, the guiding slider abuts against the first rail to maintain the engagement of the gear pinion and the gear rack.

14. The computing system of claim 12, wherein the electrical component defines a reference axis vertically passing through a gravity center thereof, wherein the gear pinion is positioned closer to the reference axis than the guiding slider.

15. The computing system of claim 11, wherein the gear rack further comprises an auxiliary rail positioned spaced apart from the first and second rails, wherein the electrical component comprises an auxiliary guiding member positioned opposite to the guiding slider with respect to the reference axis and engaged with the auxiliary rail.

* * * * *